United States Patent
Richardson

(10) Patent No.: US 6,614,322 B2
(45) Date of Patent: Sep. 2, 2003

(54) VOLTAGE CONTROLLED OSCILLATOR WITH A TRANSISTOR AND A FREQUENCY VARIABLE RESONANT CIRCUIT

(75) Inventor: Michael-Richard Richardson, Romsey (GB)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/033,040

(22) Filed: Oct. 25, 2001

(65) Prior Publication Data
US 2002/0079979 A1 Jun. 27, 2002

Related U.S. Application Data

(63) Continuation of application No. PCT/EP00/01576, filed on Feb. 25, 2000.

(51) Int. Cl.[7] .................................................. H03B 5/00
(52) U.S. Cl. ............................. 331/117 R; 331/177 V; 331/117 FE; 331/167
(58) Field of Search ....................... 331/117 R, 117 FE, 331/167, 109, 177 V, 36 C

(56) References Cited

U.S. PATENT DOCUMENTS

| 4,621,241 A | 11/1986 | Kiser ...................... 331/117 R |
| 5,144,264 A | 9/1992 | Chong et al. ........... 331/117 R |
| 5,834,983 A | * 11/1998 | Higgins, Jr. ................. 331/109 |

FOREIGN PATENT DOCUMENTS

GB     2 336 492 A     10/1999

OTHER PUBLICATIONS

International Search Report, issued by the European Patent Office for PCT/EP00/01576, dated Nov. 20, 2000.

* cited by examiner

Primary Examiner—Arnold Kinkead
(74) Attorney, Agent, or Firm—Laurence A. Greenberg; Werner H. Stemer; Ralph E. Locher

(57) ABSTRACT

A voltage controlled oscillator for wide range tuning bandwidth includes a transistor with a voltage tunable resonant circuit connected to an emitter of the transistor and inductive elements connected to the collector of the transistor. The collector is fed back to the base of the transistor. The feedback path includes the series connection of two capacitors and a resistor. A circuit node between the capacitors is inductively coupled to the base of the transistor.

7 Claims, 1 Drawing Sheet

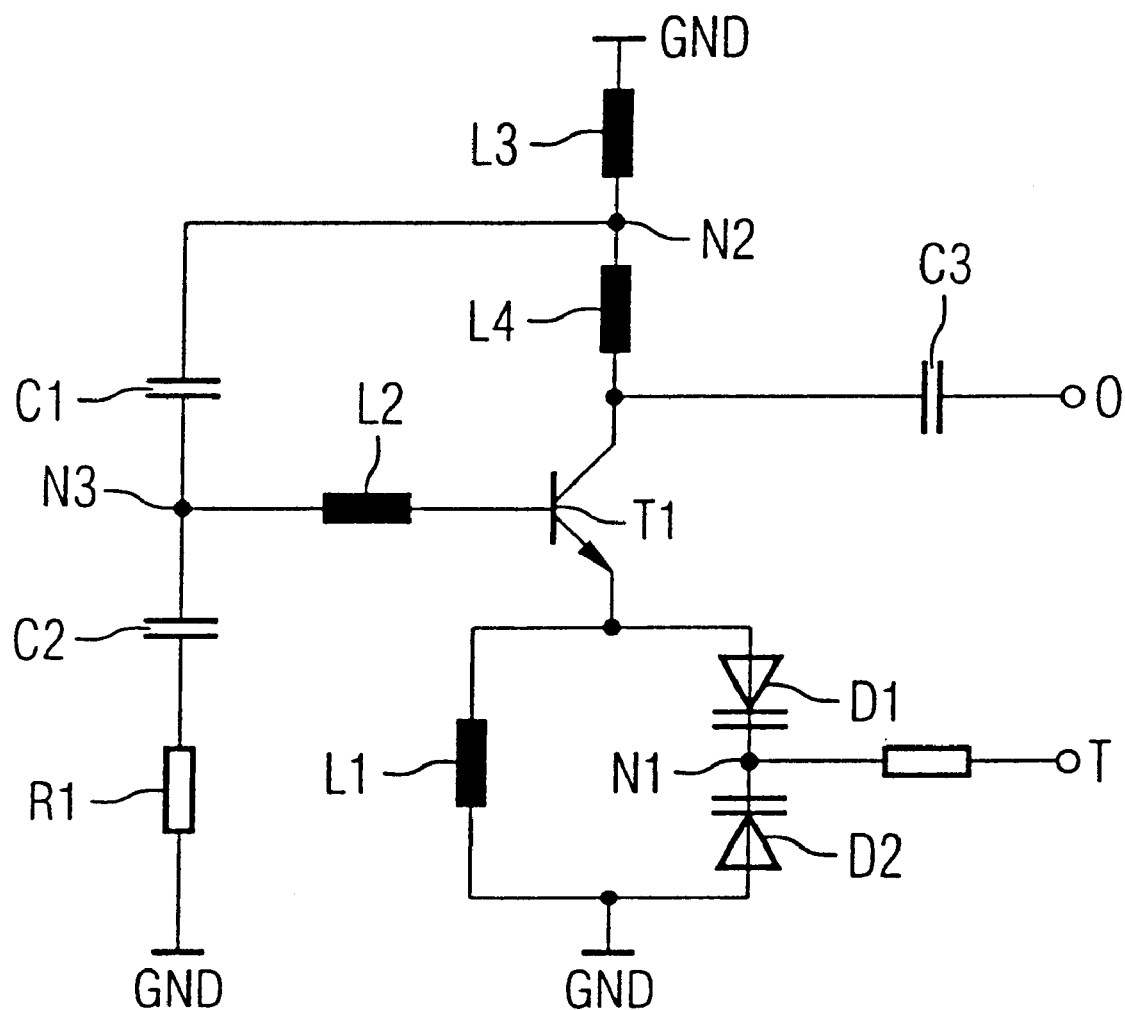

VOLTAGE CONTROLLED OSCILLATOR WITH A TRANSISTOR AND A FREQUENCY VARIABLE RESONANT CIRCUIT

CROSS-REFERENCE TO RELATED APPLICATION

This application is a continuation of copending International application PCT/EP00/01576, filed Feb. 25, 2000, which designated the United States.

BACKGROUND OF THE INVENTION

Field of the Invention

The invention refers to a voltage controlled oscillator with a transistor and a frequency variable resonant circuit connected to the transistor.

In many RF and microwave systems receivers and transmitters are required which can be tuned over a wide frequency range. The cost and complexity of the circuitry can be considerably reduced by using a single Voltage Controlled Oscillator (VCO) or using only a few VCOs. For example, for microwave sensors employing wide band continuous phase swept frequency modulation, it is essential that a single oscillator be used. VCOs also find wide application in practically every type of RF and microwave systems. A particularly important use for wide-band VCOs is in microwave sensors which employ linear frequency sweeping. This is commonly referred to as Frequency Modulated Continuous Wave, or FMCW modulation. In order for the modulation to work, the sweep must be phase continuous and the most efficient and effective way of generating such a sweep is to apply a swept drive voltage to the tuning terminal of the VCO. The range resolution of such sensors is proportional to the bandwidth of the sweep. Therefore, in many cases, a very wide sweep bandwidth is required.

The potential tuning range is often not achieved in practice, especially when the ratio of the upper and the lower frequency is equal to or above 2:1 (so called "octave" tuning). This is due to the fact that the gain of the transistor drops with increasing frequency. Therefore, the circuit stops oscillating over the upper part of the resonator tuning range.

The achievable frequency range could be extended by increasing the gain of the transistor, e.g. by increasing the collector current. However, this often causes excess gain at lower frequencies leading to instability and parasitic oscillations. A common example of this is "subharmonic" pumping, where a large signal is generated at half the expected resonant frequency.

SUMMARY OF THE INVENTION

It is accordingly an object of the invention to provide a voltage controlled oscillator which overcomes the hereinafore-mentioned disadvantages of the heretofore-known oscillators of this general type and which permits a wide tuning bandwidth to be achieved with simple circuitry.

With the foregoing and other objects in view there is provided, in accordance with the invention, a voltage controlled oscillator, including a transistor with a controlled path with a first and a second terminal and a control terminal. A frequency variable resonant circuit has an input terminal for a tuning voltage, the resonant circuit is connected between the first terminal of the controlled path of the transistor and a terminal for a reference potential. A series circuit includes a first and a second inductive element connected between the second terminal of the controlled path of the transistor and the terminal for the reference potential. A frequency dependent feedback path coupled to a circuit node between the first and the second inductive elements and the control terminal of the transistor. The feedback path includes a series circuit of a first and a second capacitive element and a resistor connected to the circuit node between the first and the second inductive elements and to the terminal for the reference potential. A third inductive element connects the circuit node between the capacitive elements to the control terminal of the transistor.

In one embodiment of the voltage controlled oscillator has an output terminal connected via a blocking capacitor to the second terminal of the transistor.

In another embodiment of the voltage controlled oscillator the first capacitive element of the feedback path is connected to the first circuit node and the second capacitive element is connected, via the resistor, to the reference potential terminal.

In another embodiment the resonant circuit of the voltage controlled oscillator includes a first and a second variable capacitance connected in series and a further inductive element connected in parallel to the first variable capacitance and the second variable capacitance. The input terminal of the resonant circuit is connected to a circuit node located between the first variable capacitance and the second variable capacitance.

In another embodiment the variable capacitances of the voltage controlled oscillator are varactor diodes. The respective cathode of the varactor diodes are connected together at a circuit node located between the first variable capacitance and the second variable capacitance.

In another embodiment the voltage controlled oscillator has a bipolar transistor. The first terminal of the transistor is an emitter connected to the resonant circuit and the second terminal of the transistor is a collector connected to the first inductive element.

In another embodiment the voltage controlled oscillator has a field effect transistor with a drain-source-path connected to the resonant circuit and to the first inductive element.

This objective is solved by a Voltage Controlled Oscillator, including a transistor with a controlled path having a first and a second terminal and a control terminal; a frequency variable resonant circuit with an input terminal for a tuning voltage, the resonant circuit being connected between the first terminal of the controlled path of the transistor and a terminal for a reference potential; a series circuit including a first and a second inductive element connected between the second terminal of the controlled path of the transistor and the terminal for the reference potential; a frequency dependent feedback path coupled to a circuit node between the first and the second inductive elements and the control terminal of the transistor; the feedback path including a series circuit of a first and a second capacitive element and a resistor connected to the circuit node between the first and the second inductive elements and to the terminal for the reference potential and having a third inductive element connected to a circuit node between the capacitive elements and to the control terminal of the transistor.

The feedback path of the oscillator includes a voltage divider with respect to the AC signal. This forms a potentiometer chain supplying the output signal of the VCO to the transistor base. The amount of feedback varies with the frequency. The feedback increases with frequency so that the gain increases at higher frequencies. As an advantage, subharmonic pumping is avoided. The amount of feedback can be adjusted according to a suitable choice of the values for the elements in the feedback path. Overall this leads to a wide tuning range for the oscillator.

The feedback path includes a first and a second capacitor and a resistor connected in serial fashion. The circuit node between the capacitors is connected to the control input of the transistor of the oscillator via an inductive element. The transistor can be of either type, e.g. a NPN bipolar transistor, a PNP bipolar transistor, or a field effect transistor.

The resonant element connected to the emitter of the bipolar transistor or the source of the field effect transistor has a tuning terminal for the reception of a control voltage. The voltage varies the characteristics of the resonant circuit. The resonant circuit includes a series connection of two varactor diodes with an inductive element connected in parallel. The tuning voltage is applied to the connection node between the varactors.

The invention provides a Voltage Controlled Oscillator which can be tuned over a wide frequency range without subharmonic pumping. Only one Voltage Controlled Oscillator is required to cover the tuning range for microwave sensors which employ linear frequency sweeping. The circuit employs relatively few elements and is relatively simple.

Other features which are considered as characteristic for the invention are set forth in the appended claims.

Although the invention is illustrated and described herein as embodied in a voltage controlled oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a schematic circuit diagram of a wideband Voltage Controlled Oscillator (VCO).

DESCRIPTION OF THE PREFERRED EMBODIMENTS

Referring now to the single FIGURE of the drawing in detail, there is seen an embodiment of the circuit according to the invention. The FIGURE shows the AC components only, any DC biasing components have been omitted for clarity and since they are dependent on the particular available power supplies. DC biasing of a resonant circuit is known to a person skilled in the art. The illustrated circuit has a NPN bipolar transistor T1, which is the gain or amplifying element. Other types of transistors like PNP bipolar transistors or field effect transistors could also be employed. The collector-emitter-path or drain-source-path is the controlled path of the transistor. The base terminal or gate terminal of the transistor is the control terminal. The resonator of the oscillator is implemented by a parallel resonant circuit which is formed by an inductor L1 and two varactor diodes D1 and D2. The diodes are connected serially with their cathodes being connected to a common circuit node N1. The inductor L1 is connected in parallel to the series connection of the diodes D1, D2. One end of the resonant circuit is connected to the emitter terminal of the transistor T1. The other end of the resonant circuit is connected to a terminal GND for a reference potential. The reference potential is ground. Frequency tuning is achieved by a bias tuning voltage to an input terminal T which is connected to the common circuit node M between the diodes D1, D2, via a suitable resistor, which provides RF isolation between the tuning voltage and the resonant circuit. Depending on the tuning voltage the capacity of the varactor diodes changes, thereby varying the resonant characteristics of the frequency variable resonant circuit.

Two inductors L3 and L4 connected in serial fashion form the RF load of the oscillator. The series connection of the inductors L3, L4 is connected between the collector of the transistor T1 and the ground terminal. The output of the oscillator circuit is connected to the collector of the transistor T1 via a blocking capacitance C3. A frequency dependent feedback circuit is applied to the oscillator. The frequency dependent feedback circuit includes the series connection of two capacitors C1, C2 and a resistor R1. Capacitor C1 is connected to the circuit node N2 between the inductors L3, L4. One terminal of resistor R1 is connected to capacitor C2, and the other end of resistor R1 is connected to ground terminal. The common circuit node N3 between capacitors C1, C2 is connected to the base terminal of transistor T1 via an inductor L2.

The inductor L2 couples the base of the transistor inductively to ground via capacitor C2 and resistor R1. The equivalent circuit of inductor L2 and transistor T1 forms an effective negative resistance which is connected in parallel with the resonator L1, D1, D2. When the value of the inductor L2 is chosen so that the negative resistance value at least equals the resistive loses in the resonator, then oscillation begins.

The feedback path, including C1, C2, R1, forms a potentiometer chain supplying the output signal of the oscillator back to the base terminal of the transistor T1 through inductor L2. The potentiometer is driven by inductor L4. The inductor L4 provides isolation between the feedback path and any output load connected to the output terminal 0. By suitable choice of the parameters C1, R1, C2 in the feedback path the amount of feedback can be adjusted suitably to increase with frequency. As a result, increased gain is provided to the base terminal of transistor T1 at higher frequencies so that any risk of subharmonic pumping is avoided. For example, the magnitude of the voltage attenuation provided by the potentiometer chain is C1/(C1+C2) at relatively low frequencies, i.e. less than 1, and at relatively high frequencies.

The tuning bandwidth is determined by the tuning capacitance range of the varactor diodes. Commercially available hyper abrupt diodes have a sufficient capacitance range to permit a tuning of the resonator circuit with the upper and lower frequencies of the tuning range forming a ratio 2:1. This is called octave tuning.

In a system using wideband VCOs the following conflicting design constraints are present:

First, due to limitations in the tuning diodes, the transistor gain, the circuit losses etc., the achievable tuning bandwidth is limited to a fraction of the center frequency. The effective practical limit is generally taken to be octave tuning, but many VCO designs cannot achieve a tuning range as wide as this octave tuning. Thus, as the required tuning bandwidth is increased, the designed center frequency of the VCO must also be increased.

Second, for reasons of performance and component cost as well as availability, most signal generation and manipulation functions are performed at a convenient intermediate frequency. Thus, as the VCO center frequency is increased the system's intermediate frequency must also be increased or an additional intermediate frequency must be introduced with the effect that the system design becomes more difficult and expensive.

Third, as the VCO center frequency is increased, an increase in the oscillator's phase noise is experienced. This is due to increased circuit losses, which lowers the quality factor of the resonator in the VCO, and increased phase noise leads to a decrease in performance of the sensor.

The VCO circuit according to the invention permits VCOs with a relatively wide possible tuning bandwidth using simple circuitry design. Overall, this leads to improved system performance at lower cost.

I claim:

1. A voltage controlled oscillator, comprising:
    a transistor having a first terminal, a second terminal, and a control terminal;
    a frequency variable resonant circuit with an input terminal for a tuning voltage, said resonant circuit connecting said first terminal of said transistor to a reference potential terminal;
    a series circuit including a first inductive element and a second inductive element connecting said second terminal of said transistor to said reference potential terminal; and
    a first circuit node located between said first and said second inductive elements;
    a second circuit node located between a first capacitive element and a second capacitive element;
    a frequency dependent feedback path connecting said first circuit node to said control terminal of said transistor, said feedback path including a series circuit of said first capacitive element and said second capacitive element and a resistor for connecting said first circuit node to said reference potential terminal, said feedback path including a third inductive element connecting said second circuit node to said control terminal of said transistor.

2. The voltage controlled oscillator according to claim 1, further comprising an output terminal connected via a blocking capacitor to said second terminal of said transistor.

3. The voltage controlled oscillator according to claim 2, wherein said first capacitive element of said feedback path is connected to said first circuit node, and said second capacitive element is connected, via said resistor, to said reference potential terminal.

4. The voltage controlled oscillator according to claim 1, wherein said resonant circuit includes a first and a second variable capacitance connected in series and a further inductive element connected in parallel to said first variable capacitance and said second variable capacitance, and said input terminal of said resonant circuit is connected to a third circuit node located between said first variable capacitance and said second variable capacitance.

5. The voltage controlled oscillator according to claim 4, wherein said variable capacitances are varactor diodes having a respective cathode, and said respective cathode of said varactor diodes are connected together at said third circuit node.

6. The voltage controlled oscillator according to claim 1, wherein said transistor is a bipolar transistor and wherein said first terminal of said transistor is an emitter connected to said resonant circuit, and said second terminal of said transistor is a collector connected to said first inductive element.

7. The voltage controlled oscillator according to claim 1, wherein said transistor is a field effect transistor having a drain-source-path connected to said resonant circuit and to said first inductive element.

* * * * *